United States Patent

Bruckert

[15] 3,648,190

[45] Mar. 7, 1972

[54] ACTIVE FILTER

[72] Inventor: Eugene J. Bruckert, Arlington Heights, Ill.

[22] Filed: Jan. 2, 1970

[21] Appl. No.: 217

[52] U.S. Cl. ............................................. 330/107, 330/109

[51] Int. Cl. ............................................. H03f 1/36

[58] Field of Search ................. 330/21, 31, 26, 28, 107, 109; 333/70 RC; 331/140, 142

[56] References Cited

UNITED STATES PATENTS 3,501,909 3/1970 Uetrecht .............................. 330/31 X

OTHER PUBLICATIONS

Mitra, " Synthesizing Active Filters," IEGE Spectrum, Jan. 1969, Page 59

*Primary Examiner*—Roy Lake
*Assistant Examiner*—James B. Mullins
*Attorney*—Mueller & Aichele

[57] ABSTRACT

An improved high-pass or low-pass active filter section is provided by taking a standard active high-pass or low-pass filter section including an amplifier and adding thereto a single impedance between the input to the amplifier and the filter input. The addition of the single component increases the attenuation capabilities of the active filter section.

11 Claims, 4 Drawing Figures

Inventor
EUGENE J. BRUCKERT
BY
Mueller, Aichele & Rauner
ATTYS.

ACTIVE FILTER

BACKGROUND OF THE INVENTION

Active filters have, in the past, been synthesized by beginning with a basic active filter section capable of producing a predetermined attenuation of the desired signal. To provide a greater attenuation two or more of the basic filter sections are cascaded. A parallel-T active filter section will provide greater attenuation than a basic active filter section. However, the parallel-T active filter section is difficult to design and requires a number of components in addition to those required for the basic active filter section.

To design an active filter section with increased attenuation, the zeros of the transfer function of the active filter section must lie in the frequency range to be attenuated. The frequency range to be attenuated is commonly termed the "stop band." For each additional pair of zeros in the "stop band" the attenuation characteristic of the filter increases by 6 db. per octave. The transfer function of a parallel-T section indicates that the parallel-T section has two more zeros in the "-stop band" than the basic active filter section, thereby providing an additional 6 db. per octave of attenuation over the basic active filter section.

SUMMARY OF THE INVENTION

It is an object of this invention to provide an improved active filter section.

Another object of this invention is to provide an improved active filter section having increased selectivity.

Yet another object of this invention is to provide an improved active filter section requiring a minimum of components.

In practicing this invention an active filter section is provided including an amplifier having an input and output. First and second impedances are serially connected between the input to the active filter section and the amplifier input. A third impedance is connected in parallel with the first and second impedances. A fourth impedance is connected from the output of the amplifier to the junction between the first and second impedances. A fifth impedance is connected from the input of the amplifier to ground potential.

The first and second impedances have the same electrical characteristics, and the third, fourth, and fifth impedances have the same electrical characteristics. In the preferred embodiment of the invention the electrical values of the first and second impedances are identical.

In providing the active low-pass filter section of this invention, the serially connected first and second impedances are resistors, and the third, fourth, and fifth impedances are capacitors.

In providing the active high-pass filter section of this invention, the serially connected first and second impedances are capacitors, and the third, fourth, and fifth impedances are resistors.

The transfer functions of the high-pass and low-pass filter sections of this invention show that there are two more zeros located in the "stop band" than in the basic active filter section, as is true of the parallel-T active filter section. The improved active filters of this invention will, therefore, provide the same attenuation as the parallel-T active filter section.

The invention is illustrated in the drawings in which.

DETAILED DESCRIPTION OF THE INVENTION

Figure 1:
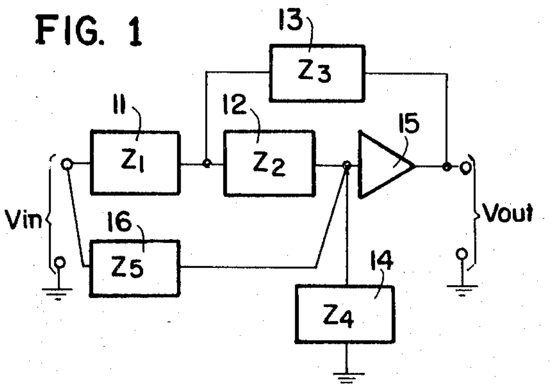
FIG. 1 is a block diagram of an active filter section incorporating the features of this invention in which the blocks are labeled as impedances.

Referring to FIG. 1 there is shown a block diagram of an active filter section embodying the features of this invention. Impedances 11 and 12 are serially connected between input 10 of the low-pass filter section and amplifier 15. Impedance 14 is coupled from the input of amplifier 15 to ground potential. Impedance 13 is coupled from the output of amplifier 15 to the junction of impedances 11 and 12.

Amplifier 15 is preferably a transistor amplifier having a high-input impedance, a low-output impedance and unity voltage gain. For many applications a single emitter-follower stage may be used for amplifier 15.

The circuit consisting of impedances 11, 12, 13 and 14, and amplifier 15, arranged as shown in FIG. 1 is considered a standard active filter section. In many applications two or more of these active filter sections are cascaded to provide the frequency attenuation desired. The addition of impedance 16 converts the standard active filter section to the improved active filter section of this invention.

Figure 2:
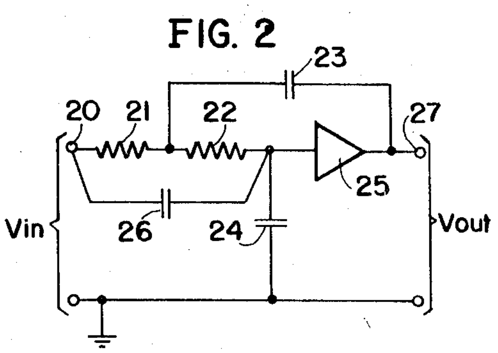
FIG. 2 is a schematic and block diagram of a low-pass filter section incorporating the features of this invention.

Referring now to FIG. 2 there is shown a low-pass active filter section embodying the features of this invention. Resistors 21 and 22 are serially connected between input 20 of the low-pass active filter section and amplifier 25. Amplifier 25 is identical to amplifier 15 previously described. Capacitor 23 is coupled from the output of amplifier 25 to the junction of resistors 21 and 22. Capacitor 24 is coupled from the input to amplifier 25 to ground potential.

The circuit consisting of resistors 21 and 22, capacitors 23 and 24, and amplifier 25, arranged as shown in FIG. 2 is considered a standard low-pass active filter section. The addition of capacitor 26 coupled from input 20 to the input of amplifier 25, converts the standard low-pass active filter section to the improved low-pass active filter section of this invention. Capacitor 26 acts as a feed forward path for the signals, partially bypassing resistors 21 and 22. In the preferred embodiment the series-connected resistors 21 and 22 are identical in value.

Figures 3, 4:
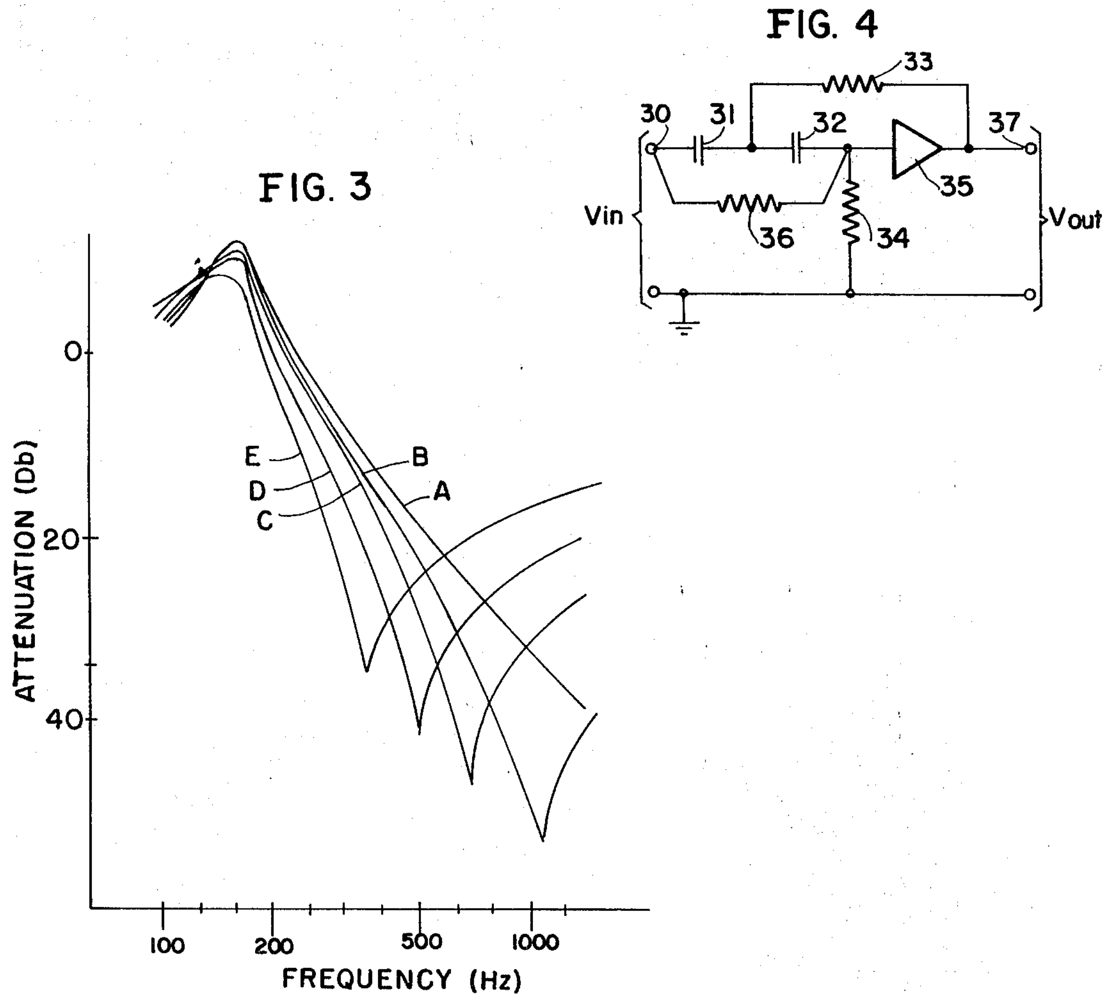
FIG. 3 is a family of graphs showing attenuation versus frequency for the improved low-pass filter section.
FIG. 4 is a schematic and block diagram of a high-pass filter section embodying the features of this invention.

Referring to FIG. 3 there is shown a series of curves of attenuation versus frequency for the circuit of FIG. 2. Curve A represents the curve of attenuation versus frequency with capacitor 26 absent. The remaining curves B, C, D, and E show amplitude versus frequency for the circuit of FIG. 2 with different values of capacitor 26. As can be seen, the addition of capacitor 26 substantially increases the attenuation over that provided by the standard active filter section.

Referring now to FIG. 4, there is shown a high-pass active filter section embodying the features of this invention. Capacitor 31 and 32 are serially connected between input 30 and the input of amplifier 35. Amplifier 35 is identical to amplifier 15 previously described. Resistor 33 is coupled from the output of amplifier 25 to the junction of capacitors 31 and 32. Resistor 34 is coupled from the input of amplifier 35 to ground potential.

The circuit consisting of capacitors 31 and 32, amplifier 35, and resistors 33 and 34, arranged as shown in FIG. 4, is considered a standard high-pass active filter section. The addition of resistor 36, coupled from input 30 to the input of amplifier 35, converts the standard high-pass active filter section to the improved high pass active filter section of this invention. In the preferred embodiment, capacitors 31 and 32 have identical electrical values. In order for the circuit of FIG. 4 to act as a high-pass filter, the value of resistor 36 is made in the order of 10 times larger than resistor 34, and the value of resistor 34 is made in the order of 10 times larger than resistor 33.

The addition of capacitor 26 to the standard low-pass active filter section, and the addition of resistor 36 to the standard high-pass active filter section has the effect of adding another pair of zeros to the transfer function representing both circuits. The additional zeros, if properly located, are responsible for increasing the attenuation capabilities of either the high-pass or low-pass active filter sections by 6 db. per octave. The attenuation characteristic is, therefore, similar to that of a parallel-T active filter section.

As can be seen, an improved active filter section has been described which requires a minimum of components. The filter section can be designed for use as a high-pass or low-pass active filter section and will provide greater attenuation than a standard active filter section. The active filter sections of this invention can be used in place of the more complex parallel-T active filter sections.

I claim:

1. A filter for passing signals in a particular frequency range and attenuating signals having frequencies outside said range by a predetermined amount including in combination, input means adapted to receive signals to be filtered, amplifier means having an input and an output, first impedance means connected to said input means, second impedance means directly connected to said first impedance means and to said input of said amplifier means, said first and second impedance means having the same electrical characteristics, third impedance means having only two terminals and being connected in parallel with said first and second impedance means between said input means and said input of said amplifier means, fourth impedance means coupled from said output of said amplifier means to the junction between said first and second impedance means, fifth impedance means coupled from said input of said amplifier means to a reference potential, said third, fourth and fifth impedance means including circuit elements all having only the same type of impedance characteristics and having different impedance characteristics from that of said first and second impedance means.

2. The filter of claim 1 wherein said first and second impedance means are capacitive reactances and said third, fourth, and fifth impedance means are resistance means.

3. The filter of claim 1 wherein said first and second impedance means are resistance means and said third, fourth, and fifth impedance means are capacitive reactances.

4. The filter of claim 1 wherein said amplifier has a relatively high input impedance, a relatively low output impedance, and substantially unity voltage gain.

5. A filter for passing signals in a particular frequency range and attenuating signals having frequencies outside said range by a predetermined amount including in combination, input means adapted to receive signals to be filtered, amplifier means having an input and an output, first resistance means coupled to said input means, second resistance means coupled to said first resistance means and to the input of said amplifier means, first reactance means coupled to the input of said amplifier means and to ground potential, second reactance means coupled from the output of said amplifier means to said first and second resistance means, third reactance means having only two terminals and being coupled to said input means and to the input of said amplifier means, said amplifier means, resistance means and reactance means forming a filter for attenuating frequencies above a particular frequency by a predetermined amount.

6. The filter of claim 5 wherein said first, second and third reactance means are capacitive reactances.

7. The filter of claim 5 wherein said first and second resistance means are equal in value.

8. A filter for passing signals in a particular frequency range and attenuating signals having frequencies outside said range by a predetermined amount including in combination, input means adapted to receive signals to be filtered, amplifier means having an input and output, first reactance means coupled to said input means, second reactance means directly connected to said first reactance means and to the input of said amplifier means, first resistance means directly connected to the input of said amplifier means and to ground potential, second resistance means coupled from the output of said amplifier means to said first and second reactance means, third resistance means having only two terminals and being connected to said input means and to the input of said amplifier means, said amplifier means, said resistance means and said reactance means forming a filter for attenuating frequencies below a particular frequency by a predetermined amount.

9. The filter of claim 8 wherein said first and second reactance means are capacitive reactances.

10. The filter of claim 8 wherein said first and second reactance means have substantially the same electrical component values.

11. The filter of claim 8 wherein said third resistance means is of the order of 10 times greater in electrical value than said second resistance means, and said second resistance means is of the order of 10 times greater in electrical value than said first resistance means.

* * * * *

UNITED STATES PATENT OFFICE
CERTIFICATE OF CORRECTION

Patent No. 3,648,190 Dated March 7, 1972

Inventor(s) Eugene J. Bruckert

It is certified that error appears in the above-identified patent and that said Letters Patent are hereby corrected as shown below:

On the cover sheet insert -- [73] Assignee Motorola, Inc., Franklin Park, Illinois --.

Signed and sealed this 12th day of December 1972.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334